United States Patent
Kim et al.

(10) Patent No.: US 11,004,499 B1
(45) Date of Patent: May 11, 2021

(54) LATENCY CONTROL CIRCUIT AND METHOD

(71) Applicant: Winbond Electronics Corp., Taichung (TW)

(72) Inventors: Young-Tae Kim, San Ramon, CA (US); Chan-Seok Park, San Jose, CA (US); Youngjoo Choi, San Jose, CA (US); Myung-Chan Choi, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/869,608

(22) Filed: May 8, 2020

(51) Int. Cl.
*G11C 7/00* (2006.01)
*G11C 11/4076* (2006.01)
*G11C 11/4096* (2006.01)

(52) U.S. Cl.
CPC ...... *G11C 11/4076* (2013.01); *G11C 11/4096* (2013.01); *G11C 2207/2272* (2013.01)

(58) Field of Classification Search
CPC ............ G11C 11/4076; G11C 11/4096; G11C 2207/2272
USPC ........................................................ 365/194
See application file for complete search history.

(56) References Cited

U.S. PATENT DOCUMENTS

| 8,576,656 | B2* | 11/2013 | Fujisawa | G11C 11/4076 365/233.1 |
| 9,997,221 | B2 | 6/2018 | Jung | |
| 2007/0076516 | A1* | 4/2007 | Fujisawa | G11C 7/1045 365/233.11 |
| 2017/0125076 | A1 | 5/2017 | Jung | |

FOREIGN PATENT DOCUMENTS

| CN | 101903953 | 12/2010 |
| TW | 201904202 | 1/2019 |

* cited by examiner

*Primary Examiner* — Vu A Le
(74) *Attorney, Agent, or Firm* — JCIPRNET

(57) ABSTRACT

A latency control circuit and method are provided. The latency control circuit includes a DLL circuit, a latency counter circuit, a synchronization circuit, and a delay line circuit. The DLL circuit enters an inactive state after locking the delay time and provides an active signal at a disable state, delay locking information and loop delay information during the inactive state. The synchronization circuit stops providing a first clock signal according to the active signal at the disable state and then synchronously outputs an operation enabling signal and a second clock signal in response to an enablement of the operation signal. The delay line circuit receives the delay locking information, the operation enabling signal, and the second clock signal and outputs an operation delay signal and an output clock signal after the delay time.

19 Claims, 10 Drawing Sheets

LATENCY CONTROL CIRCUIT AND
METHOD

BACKGROUND

Technical Field

The disclosure relates to a signal delay technology, and more particularly to a latency control circuit and a latency control method adapted to a delay-locked loop (DLL) circuit.

Description of Related Art

In a typical computer system, signal timing sequence and device operation outside a memory device are controlled by system clock, while signal timing sequence and device operation within the memory device are controlled by internal clock. To ensure the integrity of signals transmitted between the memory device and external devices, it is necessary to synchronize the internal clock with the system clock. Generally, a DLL circuit may be included in a memory device, such as a synchronous dynamic random-access memory (SDRAM), to provide the internal clock for a reading operation and an on-die termination (ODT) operation based on the system clock, so as to solve the issue that the clock signal is out of sync.

However, according to the related art, the DLL circuit is active during the reading operation, the ODT operation and remains active in most standby states except for the power-off mode, so as to adjust signal synchronization. As the speed of the memory device increases, power consumption of the DLL circuit is significantly increased, which affects the efficiency of use.

SUMMARY

The disclosure provides a latency control circuit and a latency control method, which can enable a DLL circuit to enter an inactive state in a reading operation, an ODT operation or most standby states except for a power-off mode for a certain period, and can also maintain signal synchronization during the certain period, so as to reduce power consumption.

In an embodiment of the disclosure, a latency control circuit including a DLL circuit, a latency counter circuit, a synchronization circuit, and a delay line circuit is provided. The DLL circuit receives a first clock signal and a reference clock for entering an active state to lock a delay time during which the first clock signal is being delayed and provides an active signal at an enable state during locking the delay time. The DLL circuit enters an inactive state after the delay time is locked, and provides the active signal at a disable state, delay locking information and loop delay information during the inactive state. The synchronization circuit receives the reference clock and an operation signal, provides a first clock signal to the DLL circuit according to the reference clock and the active signal at the enable state. The synchronization circuit stops providing the first clock signal according to the active signal at the disable state and then synchronously outputs an operation enabling signal and a second clock signal in response to an enablement of the operation signal. The delay line circuit receives the delay locking information, the operation enabling signal and the second clock signal and outputs an operation delay signal and an output clock signal after the delay time.

In an embodiment of the disclosure, a latency control method is provided, and the method includes: providing a first clock signal to a DLL circuit according to a reference clock and an active signal at an enable state; in response to receiving the first clock signal and the reference clock, activating the DLL circuit to lock a delay time during which the first clock signal is being delayed, wherein the active signal is at the enable state during locking the delay time; after the delay time being locked, inactivating the DLL circuit and providing the active signal at a disable state, delay locking information and loop delay information by the inactivated delay-locked loop circuit; stopping providing the first clock signal according to the active signal at the disable state and then synchronously outputting an operation enabling signal and a second clock signal in response to an enablement of an operation signal; and receiving the delay locking information, the operation enabling signal and the second clock signal by a delay line circuit, and synchronously outputting an operation delay signal and an output clock signal after the delay time according to the delay locking information.

Based on the above, the latency control circuit and the latency control method of provided in one or more embodiments of the disclosure enable the DLL circuit to enter the inactive state after locking the delay time of the signal. At the same time, the signal is delayed in the locked delay time by the delay line circuit other than the DLL circuit. Thereby, the DLL circuit can be in the inactive state when the reading operation and the ODT operation are performed, so as to reduce the power consumption.

In order to make the aforementioned and other advantages of the disclosure comprehensible, embodiments accompanied with figures are described in detail below.

DESCRIPTION OF THE EMBODIMENTS

Figure 1:
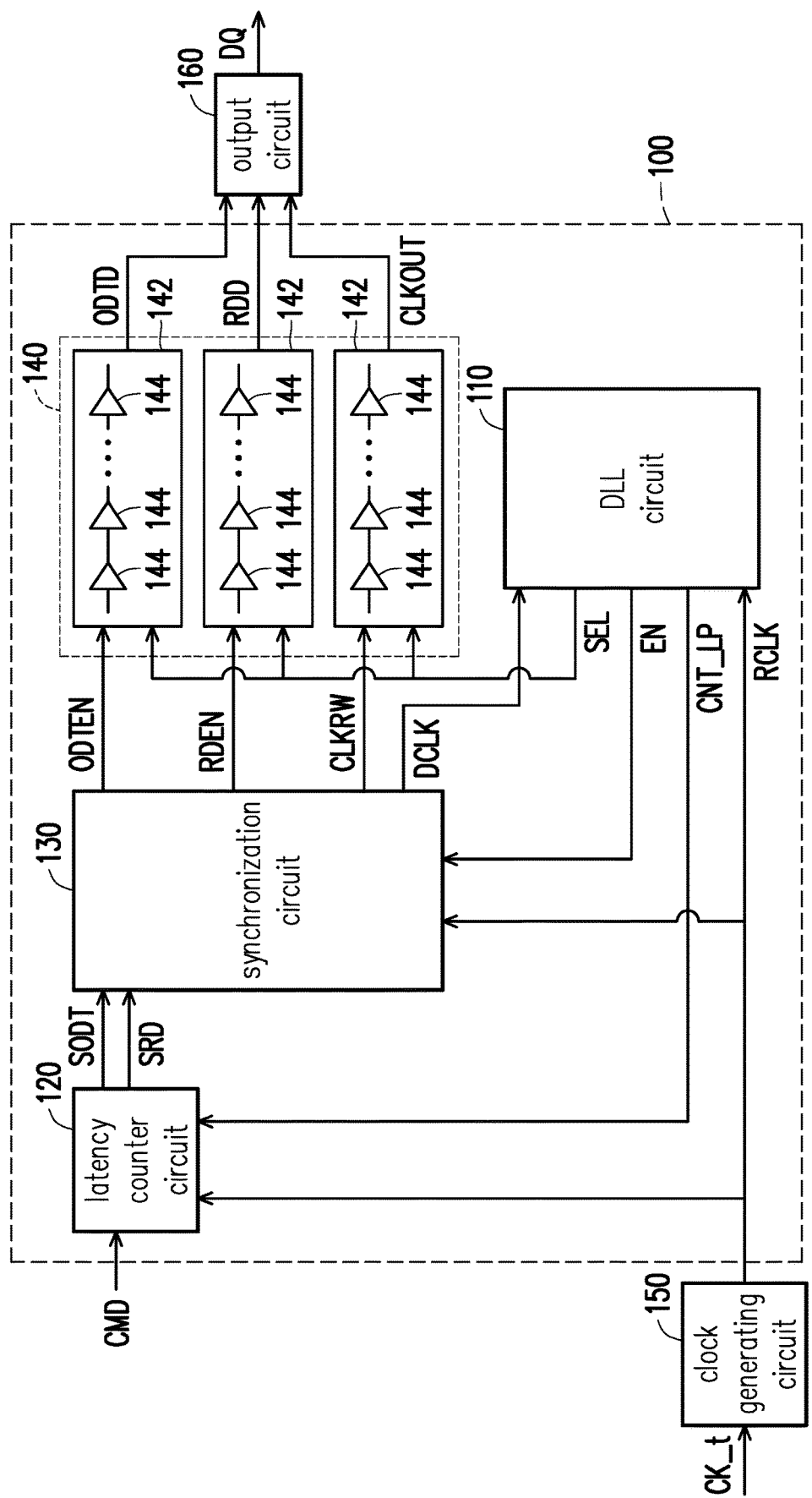
FIG. 1 is a schematic circuitry diagram of a latency control circuit according to an embodiment of the disclosure.

Please refer to FIG. 1. FIG. 1 is a schematic circuitry diagram of a latency control circuit according to an embodiment of the disclosure. The latency control circuit 100 is built in, for instance, a synchronous semiconductor memory, such as an SDRAM, to perform the required delay and synchronization of signals according to circuit configuration and operation. As shown in FIG. 1, the latency control circuit 100 includes a DLL circuit 110, a latency counter circuit 120, a synchronization circuit 130, and a delay line circuit 140.

The synchronization circuit 130 is coupled to the DLL circuit 110, the latency counter circuit 120 and the delay line circuit 140. The synchronization circuit 130 receives an operation signal (a reading operation signal SRD or an ODT operation signal SODT) provided by the latency counter circuit 120, and receives a reference clock RCLK. The reference clock RCLK is, for instance, a clock signal which is configured inside the memory device and may be provided by a clock generating circuit 150 according to a received system clock CK_t. To perform a DLL locking operation, the synchronization circuit 130 may provide a first clock signal DCLK to the DLL circuit 110 in response to the reference clock RCLK and an active signal EN at an enable state (for example, at high logic level) provided by the DLL circuit 110. After the DLL locking operation has been completed, the active signal EN provided by the DLL circuit 110 is changed to be at a disable state (for example, the active signal EN is pulled down to low logic level), such that the synchronization circuit 130 may stop providing the first clock signal DCLK according to the active signal EN at the disable state, thereby the DLL circuit 110 enters an inactive state.

During the DLL locking operation, a delay time for delaying the first clock signal DCLK is determined by the DLL circuit 110, and then delay locking information SEL and loop delay information CNT_LP are stored in the DLL circuit 110. After the DLL locking operation has been completed, the delay locking information SEL and the loop delay information CNT_LP stored in the DLL circuit 110 are provided to the delay line circuit 140 and the latency counter circuit 120, respectively. Therefore, according to the delay locking information SEL, a delay time for delaying the output of the synchronization circuit 130 is determined.

Figure 2A:
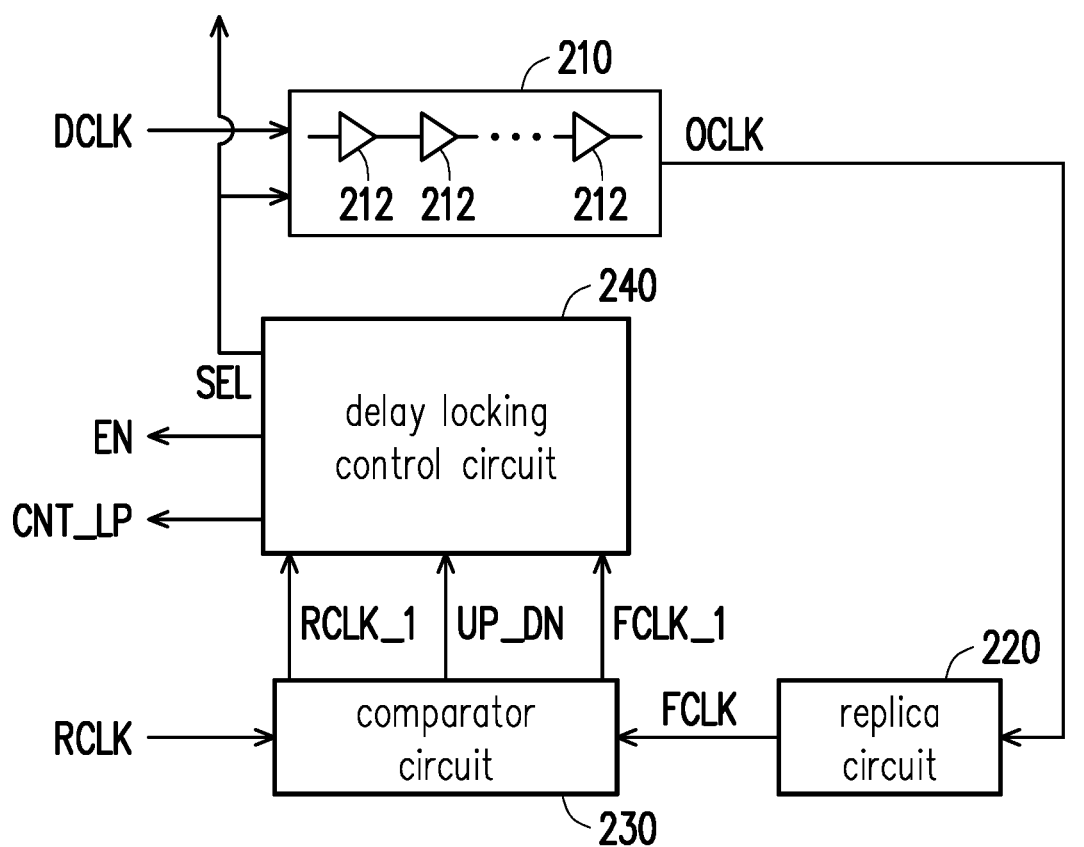
FIG. 2A is a schematic circuitry diagram of a DLL circuit according to an embodiment of the disclosure.

For instance, FIG. 2A is a schematic circuitry diagram of a DLL circuit according to an embodiment of the disclosure. As shown in FIG. 2A, the DLL circuit 110 includes a delay time determination circuit 210, a replica circuit 220, a comparator circuit 230, and a delay locking control circuit 240.

In FIG. 2A, the delay time determination circuit 210 includes, for instance, a plurality of delay units 212. The delay units 212 may be serially connected or connected in any manner, and each of the delay units 212 may be a positive delay element or an inverse delay element.

The delay time determination circuit 210 may receive the first clock signal DCLK and the delay locking information SEL and output a delayed clock signal OCLK after the delay time generated by the delay units 212. Specifically, the time interval between delay time determination circuit 210 receiving the first clock signal DCLK and outputting the delayed clock signal OCLK by the delay time determination circuit 210 is the delay time determined by a delay line composed of the delay units 212 selected by the delay locking information SEL. Therefore, the delay time determination circuit 210 may adjust the delay progression (i.e., the number of selected degrees of the delay unit 212) according to the delay locking information SEL, so as to determine the delay time.

The replica circuit 220 is coupled to the delay time determination circuit 210. The replica circuit 220 receives the delayed clock signal OCLK to provide a feedback clock signal FCLK, thereby compensating for the delay caused by an output terminal of the latency control circuit 100. In an embodiment, the replica circuit 220 is a replica of an output circuit 160 coupled to the output of the delay line circuit 140.

The comparator circuit 230 is coupled to the replica circuit 220. The comparator circuit 230 receives the reference clock RCLK and compares a phase difference of the reference clock RCLK with the feedback clock signal FCLK and provides a comparison result UP_DN to the delay locking control circuit 240. In an embodiment, when the raising edge of the feedback clock signal FCLK is ahead of the raising edge of the reference clock RCLK, the comparison result UP_DN is at a high logic level to increase the delay time thereafter; when the raising edge of the feedback clock signal FCLK is back of the raising edge of the reference clock RCLK, the comparison result UP_DN is at a low logic level to decrease the delay time thereafter. Accordingly, based on the comparison result UP_DN, the phase of the feedback clock signal FCLK can be shifted ahead or back to correspond with the phase of the reference clock RCLK by the delay locking information SEL updated by the delay locking control circuit 240. In addition, the comparator circuit 230 also provides a delayed reference clock RCLK_1 with the same phase as the reference clock RCLK and a delayed feedback clock signal FCLK_1 with the same phase as the feedback clock signal FCLK to the delay locking control circuit 240.

The delay locking control circuit 240 is coupled to the delay time determination circuit 210 and the comparator circuit 230. The delay locking control circuit 240 may output the delay locking information SEL and the loop delay information CNT_LP according to the delayed reference clock RCLK_1, the delayed feedback clock signal FCLK_1 and the comparison result UP_DN. Specifically, the delay locking control circuit 240 may transmit the delay locking information SEL to the delay time determination circuit 210 according to the comparison result UP_DN, so as to adjust the delay time during which the first clock signal DCLK is being delayed. Then, the delay locking control circuit 240 may lock the adjusted delay time (i.e., fix the delay time) by latching the corresponding delay locking information SEL in the delay locking control circuit 240 and output the corresponding delay locking information SEL and the corresponding loop delay information CNT_LP to the delay line circuit 140 and the latency counter circuit 120, respectively. The loop delay information CNT_LP indicates how many cycles of loop delay provided by the DLL locking operation. In an embodiment of the disclosure, the loop delay information CNT_LP is a four-bit digital number which is "0000" before the DLL locking operation is finished and is changed to another value after the DLL locking operation is finished.

Figure 2B:
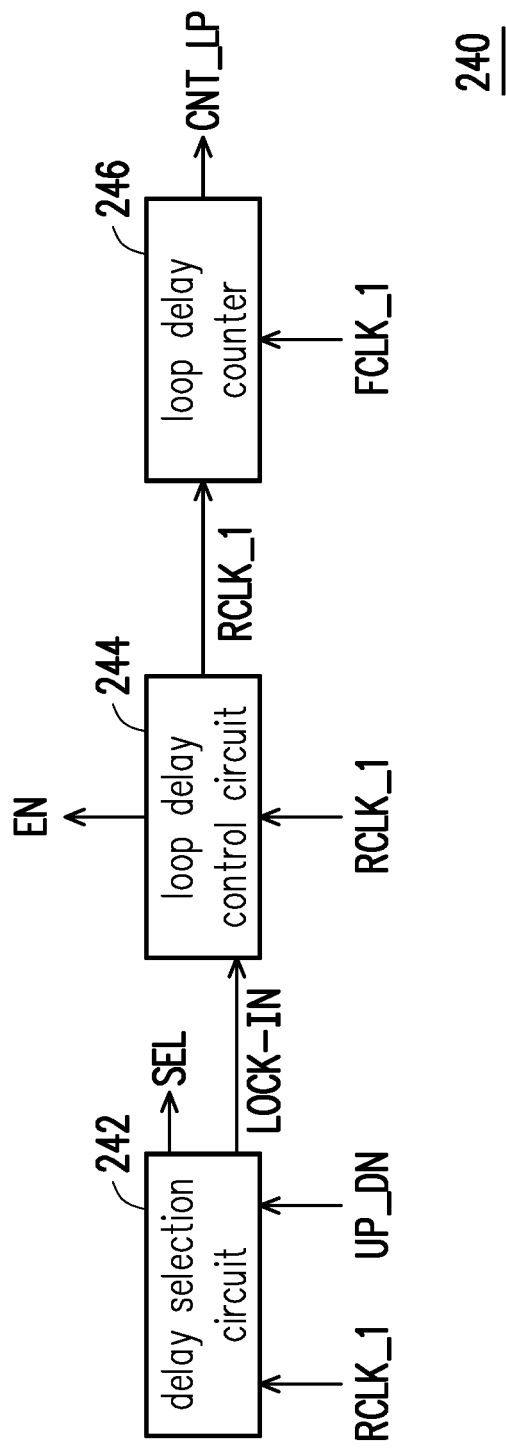
FIG. 2B is a schematic circuitry diagram of a delay locking control circuit according to an embodiment of the disclosure.

FIG. 2B is a schematic circuitry diagram of a delay locking control circuit according to an embodiment of the disclosure. As shown in FIG. 2B, the delay locking control circuit 240 includes a delay selection circuit 242, a loop delay control circuit 244 and a loop delay counter 246. The delay selection circuit 242 receives the delayed reference clock RCLK_1 and the comparison result UP_DN to perform a DLL locking algorithm. The delay selection circuit 242 may provide the delay locking information SEL to the delay time determination circuit 210 according to the comparison result UP_DN. After the DLL locking algorithm is completed, the delay selection circuit 242 may generate a lock-in signal LOCK-IN at a high logic level internally for indicating that the DLL locking operation is finished. On the other hand, when the DLL locking operation is undergoing, the lock-in signal LOCK-IN is at a low logic level.

The loop delay control circuit 244 is coupled to the delay selection circuit 242. After receiving the lock-in signal LOCK-IN, the loop delay control circuit 244 changes the active signal EN to be at the disable state and outputs the active signal EN at the disable state to the synchronization circuit 130, so that the DLL circuit 110 enters an inactive state by stopping being provided with the first clock signal DCLK, and the delayed feedback clock signal FCLK_1 is interrupted accordingly. The loop delay control circuit 244 also receives the delayed reference clock RCLK_1 and then transmits the delayed reference clock RCLK_1 to the loop delay counter 246.

The loop delay counter 246 is coupled to the loop delay control circuit 244 and generates the loop delay information CNT_LP based on the delayed feedback clock signal FCLK_1 and the delayed reference clock RCLK_1. In particular, in reference with the delayed reference clock RCLK_1, the loop delay counter 246 may count number of clocks from receiving the delayed feedback clock signal FCLK_1 until the delayed feedback clock signal FCLK_1 is interrupted, so as to generate the loop delay information CNT_LP.

As shown in FIG. 1, the latency counter circuit 120 is coupled to the DLL circuit 110 and the synchronization circuit 130. The latency counter circuit 120 may delay an enablement of the operation signal according to an operation command CMD, the reference clock RCLK and the loop delay information CNT_LP. The operation command CMD is provided, for instance, by a command decoding circuit, and may notify the SDRAM of performing a reading operation or an on-die termination (ODT) operation. Moreover, the operation command CMD includes additional latency information, for instance, additional latency AL, column address strobe latency CL, column address strobe write latency CWL, and the like. In addition, the delay time determination circuit 210 may control the latency counter circuit 120 to delay the enablement of the operation signal according to a calculation result of deducting the loop delay information CNT_LP from the additional latency information. In an embodiment of the disclosure, the operation signal may include a reading operation signal SRD or an ODT operation signal SODT.

Figure 2C:
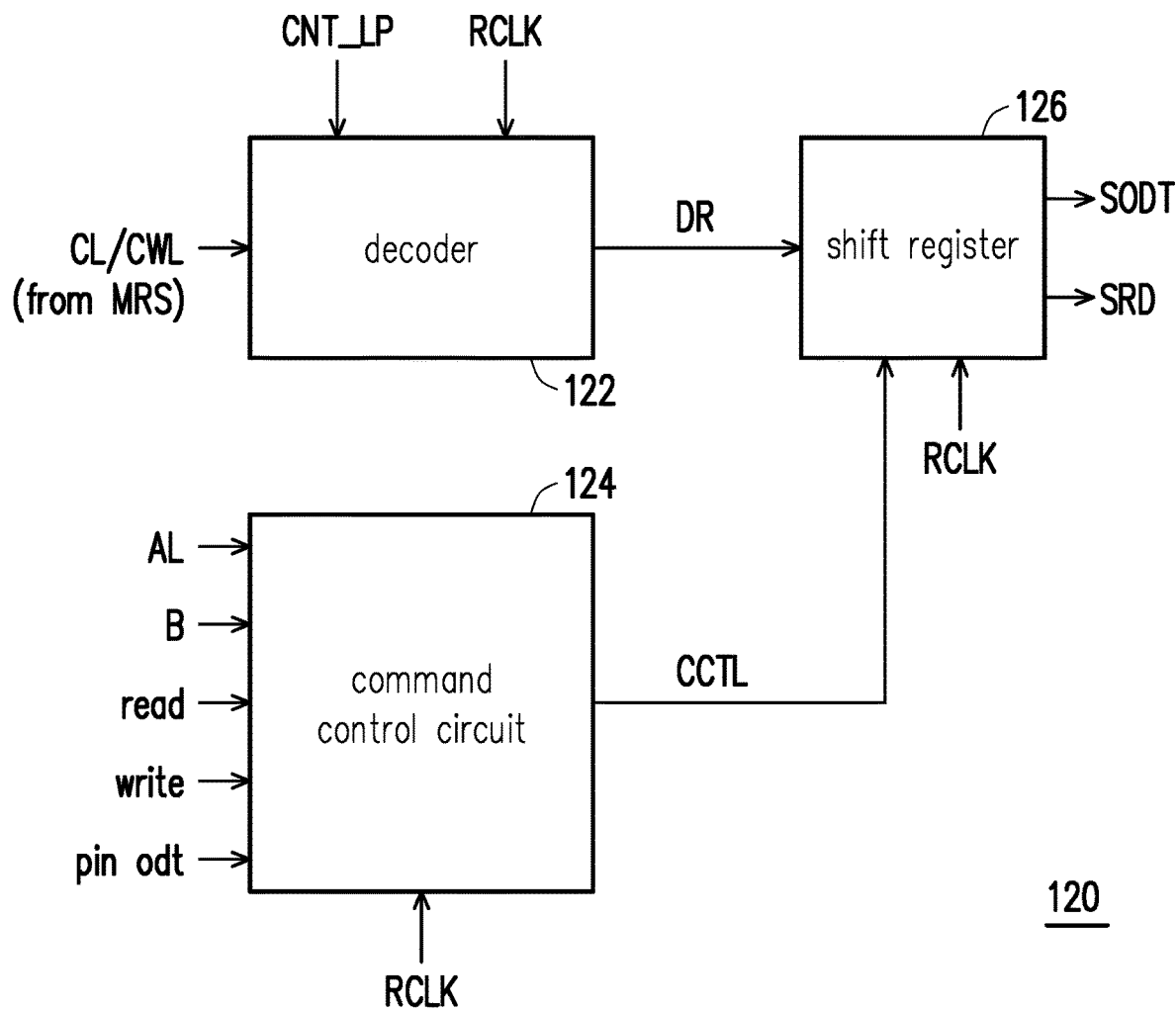
FIG. 2C is a schematic circuitry diagram of a latency counter circuit according to an embodiment of the disclosure.

FIG. 2C is a schematic circuitry diagram of a latency counter circuit according to an embodiment of the disclosure. As shown in FIG. 2C, the latency counter circuit 120 includes a decoder 122, a command control circuit 124 and a shift register 126. The decoder 122, the command control circuit 124 and the shift register 126 receives the reference clock RCLK for operating. The decoder 122 decodes the loop delay information CNT_LP, the column address strobe latency CL or the column address strobe write latency CWL to transmit a decoded result DR (which indicates time period of CL-CNT_LP or CWL-CNT_LP) to the shift register 126.

The operation command CMD further includes a burst information B and command signals read, write or pin odt. The command control circuit 124 manipulates the command signals read, write or pin odt to make a command pulse (for command signal read) or a combination of a first command pulse and a last command pulse (for command signals write or pin odt) based on the additional latency AL and the burst information B. When the command control circuit 124 receives the command signal read, the command control circuit 124 may decide pulse width of the command pulse for the command signal read. When the command control circuit 124 receives the command signal write or pin odt, the command control circuit 124 may decide $1^{st}$ pulse & last pulse timing for the command signal write or pin odt. And then the command control circuit 124 transfers a corresponding command control signal CCTL to the shift register 126 based on the command signals read, write or pin odt.

The shift register 126 is coupled to the decoder 122 and the command control circuit 124. The shift register 126 may enable the ODT operation signal SODT or the reading operation signal SRD after delaying the time period of AL+CL-CNT_LP-B or AL+CWL-CNT_LP-B according to the decoded result DR and the command control signal CCTL.

In addition, the synchronization circuit 130 may synchronously output an operation enabling signal and a second clock signal CLKRW in response to the enablement of the operation signal. In an embodiment of the disclosure, the operation enabling signal may include a reading operation enabling signal RDEN or an ODT operation enabling signal ODTEN. Specifically, the synchronization circuit 130 may, in response to the enablement of the reading operation signal SRD, synchronously output the reading operation enabling signal RDEN and the second clock signal CLKRW; alternatively, the synchronization circuit 130 may, in response to the enablement of the ODT operation signal SODT, synchronously output the ODT operation enabling signal ODTEN and the second clock signal CLKRW.

Figure 2D:
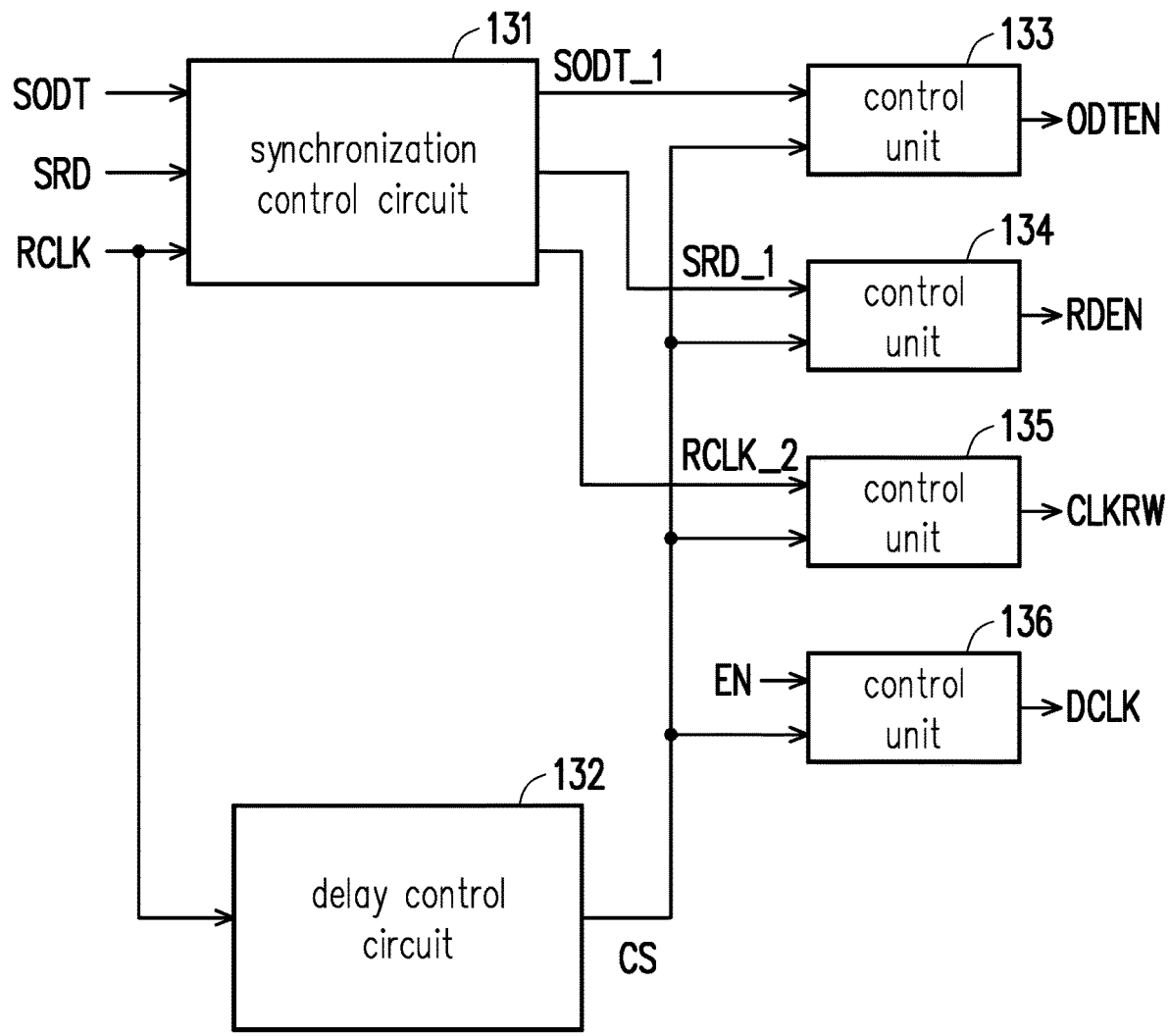
FIG. 2D is a schematic circuitry diagram of a synchronization circuit according to an embodiment of the disclosure.

FIG. 2D is a schematic circuitry diagram of a synchronization circuit according to an embodiment of the disclosure. As shown in FIG. 2D, the synchronization circuit 130 includes a synchronization control circuit 131, a delay control circuit 132 and control units 133-136. The synchronization control circuit 131 receives the reading operation signal SRD or the ODT operation signal SODT and combines the reference clock RCLK with the reading operation signal SRD or the ODT operation signal SODT to generate a reading operation signal SRD_1 or a ODT operation signal SODT_1. The reading operation signal SRD_1 is transmitted to the control unit 134. The ODT operation signal SODT_1 is transmitted to the control unit 133. In addition, the synchronization control circuit 131 outputs the sub-reference clock RCLK_2 to the control unit 135 during the period of receiving the reading operation signal SRD or the ODT operation signal SODT. The delay control circuit 132 may include a delay unit for delaying the reference clock RCLK to transmit a control signal CS to the control units 133-136, so as to guarantee there is enough time for generating the reading operation signal SRD_1, the ODT operation signal SODT_1, and the sub-reference clock RCLK_2.

The control units 133-136 are coupled to the synchronization control circuit 131 and the delay control circuit 132, and each of the control units 133-136 may include a clock gating circuit implemented with latch scheme or flip-flop scheme. The control units 133-136 respectively control the clock gating circuits for the related timing among the reading operation enabling signal RDEN, the ODT operation enabling signal ODTEN, the second clock signal CLKRW and the first clock signal DCLK according to the control signal CS.

The delay line circuit 140 is coupled to the DLL circuit 110 and the synchronization circuit 130. Accordingly, the delay line circuit 140 may receive the delay locking information SEL, the operation enabling signal (the reading operation enabling signal RDEN or the ODT operation enabling signal ODTEN), and the second clock signal CLKRW, and after the delay time locked by the DLL circuit 110, the delay line circuit 140 may synchronously output an operation delay signal and an output clock signal CLKOUT. In an embodiment of the disclosure, the operation delay signal may include a reading operation delay signal RDD or an ODT operation delay signal ODTD.

Specifically, the delay line circuit 140 includes, for instance, a plurality of delay time determination circuit replicas 142. Each delay time determination circuit replica 142 consists of delay units 144, and is a replica of the delay time determination circuit 210. As shown in FIG. 1, in the delay line circuit 140 provided in an embodiment of the disclosure, a first delay time determination circuit replica 142 is configured to delay the ODT operation enabling signal ODTEN, a second delay time determination circuit replica 142 is configured to delay the reading operation enabling signal RDEN and a third delay time determination circuit replica 142 is configured to delay the second clock signal CLKRW. The three delay time determination circuit replicas 142 are connected in parallel between the synchronization circuit 130 and the output circuit 160.

It can be observed from FIG. 1 and FIG. 2A that the delay line circuit 140 and the delay time determination circuit 210 provided in an embodiment of the disclosure adjust delay progression of the delay line according to the same delay locking information SEL. Therefore, the delay line circuit 140 may adjust the number of selected degrees of the delay units 144 on each delay time determination circuit replica 142 according to the delay locking information SEL, so that the resultant delay time provided by the delay line circuit 140 is equal to the delay time locked by the DLL circuit 110.

According to the circuit configuration of the DLL circuit 110 provided in an embodiment of the disclosure, the DLL circuit 110 may enter the inactive state after locking the delay time during which the first clock signal DCLK is being delayed. Besides, while the DLL circuit 110 is in the inactive state, the delay line circuit 140 may delay the operation enabling signal (the reading operation enabling signal RDEN or the ODT operation enabling signal ODTEN) and the second clock signal CLKRW for the delay time locked by the DLL circuit 110 according to the same delay locking information SEL, so as to output the operation delay signal (the reading operation delay signal RDD or the ODT operation delay signal ODTD) and the output clock signal CLKOUT to control the output of data DQ by the output circuit 160. Thereby, the DLL circuit 110 can stay inactive for a certain period in a reading operation, an ODT operation or in most standby states except for a power-off mode, whereby power consumption is reduced.

Figure 3:
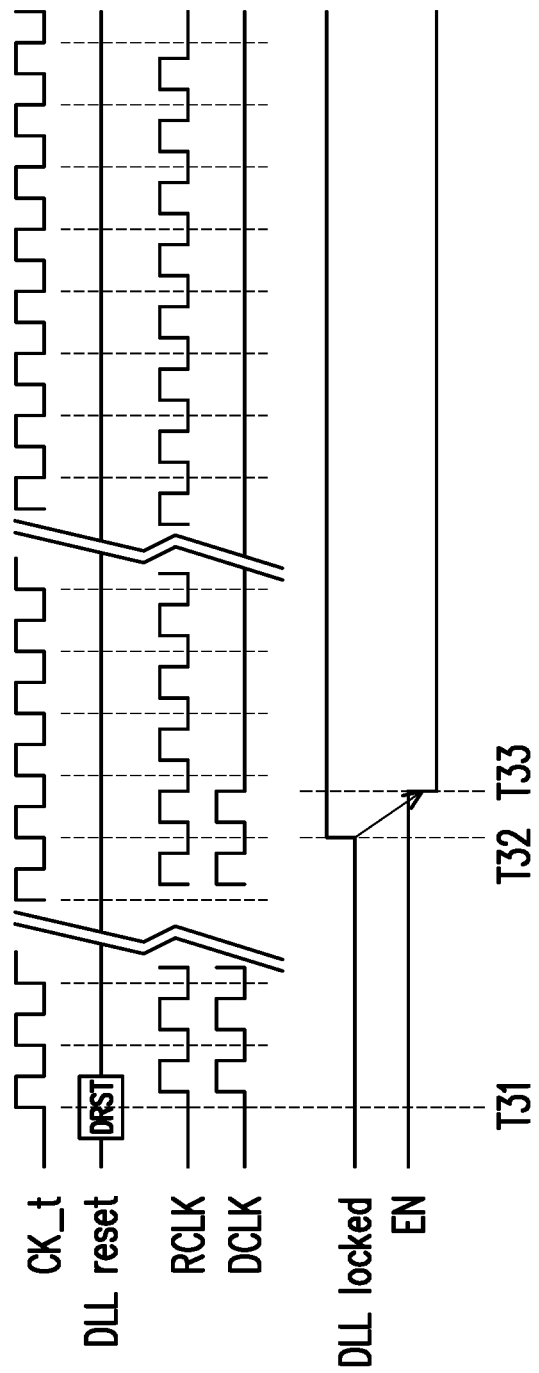
FIG. 3 is a schematic diagram of a delay-locked signal waveform according to an embodiment of the disclosure.

FIG. 3 is a schematic diagram of a delay-locked signal waveform according to an embodiment of the disclosure. The manner in which the latency control circuit 100 performs delay locking according to an embodiment of the disclosure is described below. Please refer to FIG. 1, FIG. 2A, and FIG. 3.

In FIG. 3, at a time point T31, the DLL circuit 110 receives a reset command DRST and begins to adjust the delay line to relock the delay time during which the first clock signal DCLK is being delayed. When the DLL circuit 110 determines the delay time (i.e., at a time point T32), the DLL circuit 110 may lock the delay time and accordingly provide the delay locking information SEL and the loop delay information CNT_LP to the delay line circuit 140 and the latency counter circuit 120, respectively. Next, at a time point T33, the delay locking control circuit 240 of the DLL circuit 110 disables the active signal EN, for instance, pulling the active signal EN to a low logic level, such that the synchronization circuit 130 may stop providing the first clock signal DCLK (or the first clock signal DCLK is fixed at the low logic level) according to the disablement of the active signal EN, so that the DLL circuit 110 enters the inactive state. The reset command DRST may be generated, for instance, when the memory device is started, when mode register setting (MRS) is performed, at the time of exiting the IDD6 mode and the IDD8 mode, or when any other reset pin is triggered.

Figure 4:
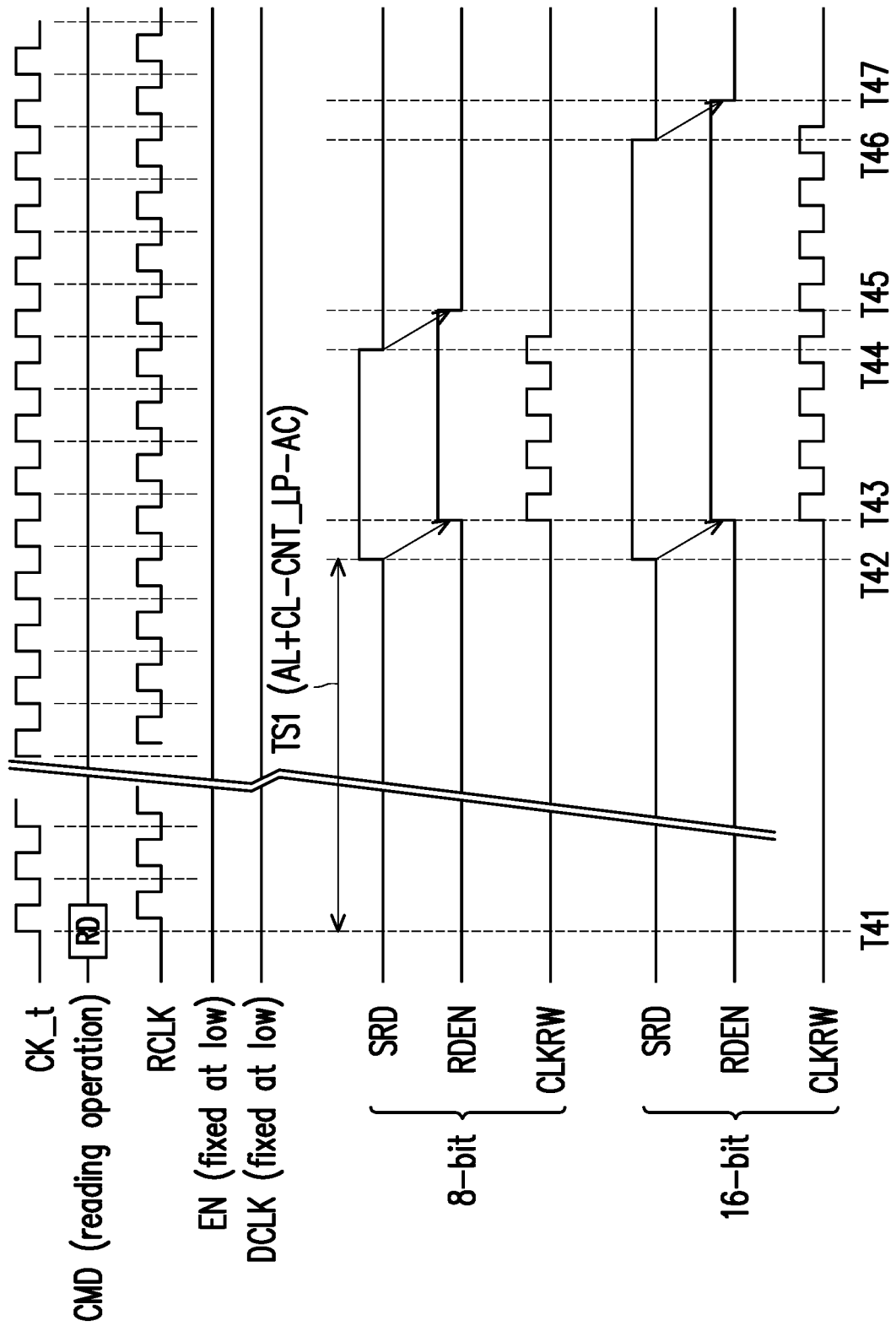
FIG. 4 is a schematic diagram of a signal waveform of a reading operation according to an embodiment of the disclosure.

FIG. 4 is a schematic diagram of a signal waveform of a reading operation according to an embodiment of the disclosure. After the DLL locking operation has been completed, the DLL circuit 110 provided in the embodiment of the disclosure is in the inactive state; therefore, when a reading operation is performed, the first clock signal DCLK and the active signal EN remain at the low logic level shown as being disabled. The manner in which the latency control circuit 100 performs the reading operation according to an embodiment of the disclosure is described below. Please refer to FIG. 1, FIG. 2A, and FIG. 4.

In FIG. 4, the reading operation is divided into 8-bit and 16-bit for explanation. At a time point T41, the operation command CMD received by the latency counter circuit 120 is a read command RD to perform the reading operation. The latency counter circuit 120 may enable the reading operation signal SRD after delaying a time period TS1 according to the read command RD and the loop delay information CNT_LP. The reading operation signal SRD is activated at a falling edge of the reference clock RCLK. The time period TS1 is, for instance, AL+CL-CNT_LP-AC. Here, AL is the additional latency, CL is the column address strobe latency, and AC is the arbitrary cycles of the reference clock RCLK configured to match the circuit design.

When the latency counter circuit 120 enables the reading operation signal SRD (i.e., at a time point T42), the synchronization circuit 130 may respond to the enablement of the reading operation signal SRD and then synchronously output the reading operation enabling signal RDEN and the second clock signal CLKRW at a time point T43. In an embodiment of the disclosure, the activated reading operation signal SRD and activated the reading operation enabling signal RDEN are, for instance, static signals maintained at the high logic level for a specific period.

The latency counter circuit 120 may disable the reading operation signal SRD at a time point T44 when the 8-bit reading operation is performed. The synchronization circuit 130 may respond to the disablement of the reading operation signal SRD and stop outputting the reading operation enabling signal RDEN and the second clock signal CLKRW at a time point T45.

The latency counter circuit 120 may disable the reading operation signal SRD at a time point T46 when the 16-bit reading operation is performed. The synchronization circuit 130 may respond to the disablement of the reading operation signal SRD and stop outputting the reading operation enabling signal RDEN and the second clock signal CLKRW at a time point T47.

Figure 5:
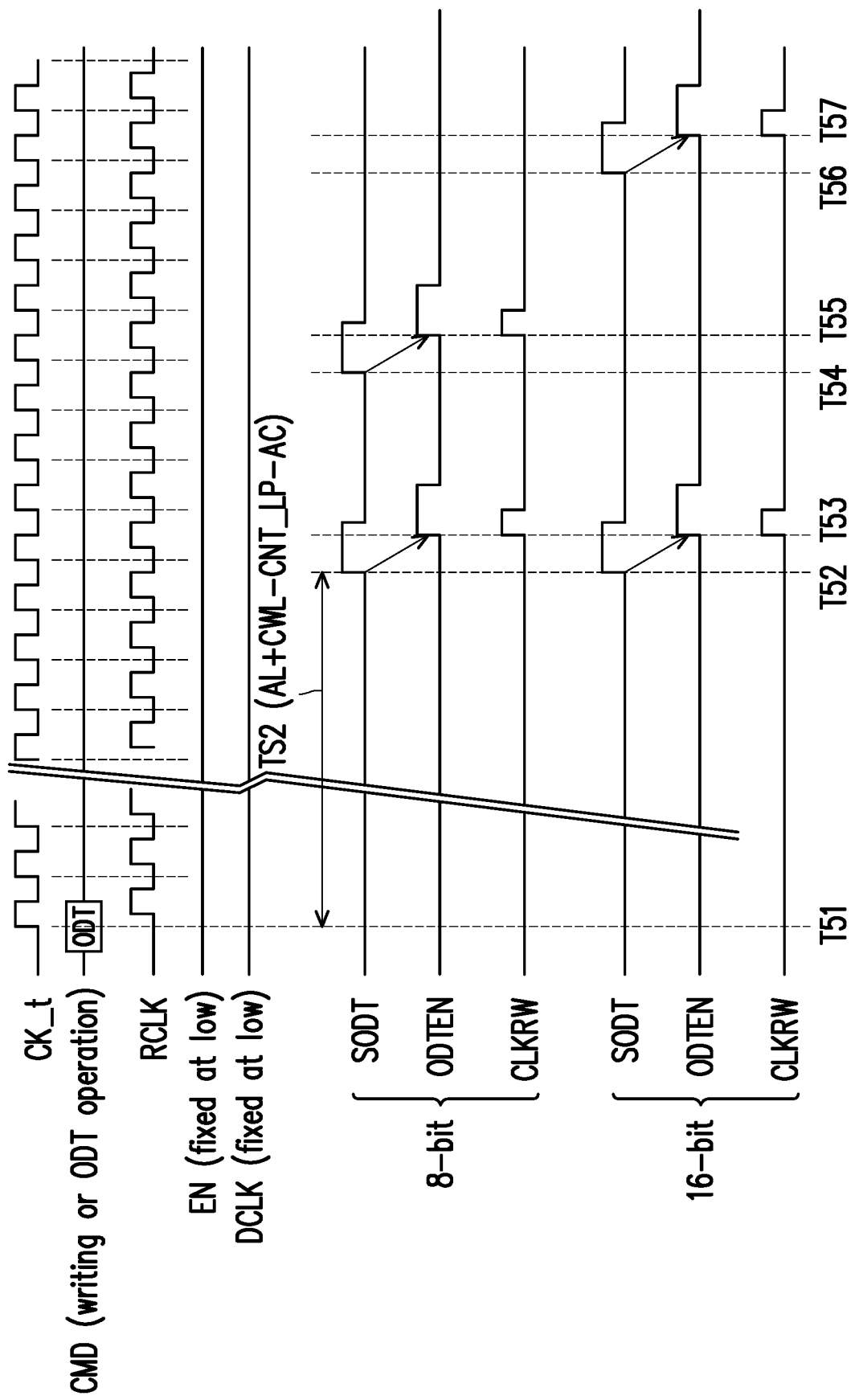
FIG. 5 is a schematic diagram of a signal waveform of an ODT operation according to an embodiment of the disclosure.

FIG. 5 is a schematic diagram of a signal waveform of an ODT operation according to an embodiment of the disclosure. Similarly, after the DLL locking operation has been completed, when the ODT operation is performed, the DLL circuit 110 provided in the embodiment of the disclosure is in the inactive state; therefore, the first clock signal DCLK and the active signal EN remain at the low logic level shown as being disabled. The manner in which the latency control circuit 100 performs the ODT operation according to an embodiment of the disclosure is described below. Please refer to FIG. 1, FIG. 2A, and FIG. 5.

In FIG. 5, the ODT operation is also divided into 8-bit and 16-bit for explanation. At a time point T51, the operation command CMD received by the latency counter circuit 120 is a command ODT to performing a writing operation or an ODT operation. The latency counter circuit 120 may enable the ODT operation signal SODT after delaying a time period TS2 according to the command ODT and the loop delay information CNT_LP. The ODT operation signal SODT is activated at a falling edge of the reference clock RCLK. The time period TS2 is, for instance, AL+CWL-CNT_LP-B. Here, AL is the additional latency, CWL is the column address strobe write latency, CNT_LP is the latency associated with the DLL circuit 110, and B is the arbitrary cycles of the reference clock RCLK configured to match the circuit design.

When the latency counter circuit 120 enables the ODT operation signal SODT (i.e., at a time point T52), the synchronization circuit 130 may respond to the enablement of the ODT operation signal SODT and then synchronously output the ODT operation enabling signal ODTEN and the second clock signal CLKRW at a time point T53. In an embodiment of the disclosure, each of the activated ODT operation signal SODT and the activated ODT operation enabling signal ODTEN is, for instance, a pulse signal.

When the 8-bit ODT operation is performed, the latency counter circuit 120 may again enable the ODT operation signal SODT at a time point T54. The synchronization circuit 130 may respond to the enablement of the ODT operation signal SODT and then synchronously output the ODT operation enabling signal ODTEN and the second clock signal CLKRW at a time point T55.

When the 16-bit ODT operation is performed, the latency counter circuit 120 may again enable the ODT operation signal SODT at a time point T56. The synchronization circuit 130 may respond to the enablement of the ODT operation signal SODT and then synchronously output the ODT operation enabling signal ODTEN and the second clock signal CLKRW at a time point T57.

Figure 6:
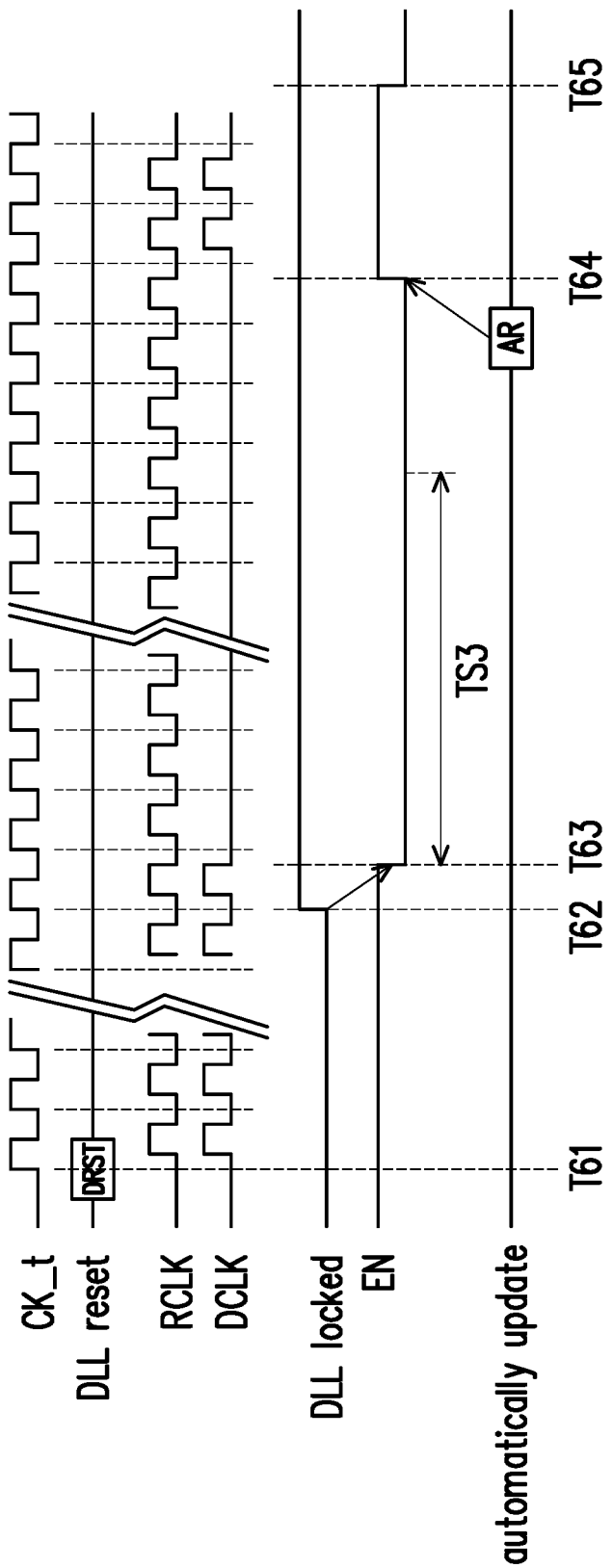
FIG. 6 is a schematic diagram of a delay-locked and updated signal waveform according to an embodiment of the disclosure.

FIG. 6 is a schematic diagram of a delay-locked and updated signal waveform according to an embodiment of the disclosure. The manner in which the latency control circuit 100 performs delay locking and updating according to an embodiment of the disclosure is described below. Please refer to FIG. 1, FIG. 2A, and FIG. 6.

In FIG. 6, at a time point T61, the DLL circuit 110 receives the reset command DRST and begins to adjust the delay line to relock the delay time during which the first clock signal DCLK is being delayed. When the DLL circuit 110 determines the delay time (i.e., a time point T62), the DLL circuit 110 may lock the delay time and accordingly provide the delay locking information SEL and the loop delay information CNT_LP. Next, at a time point T63, the delay locking control circuit 240 of the DLL circuit 110 disables the active signal EN, for instance, pulling the active signal EN to the low logic level, and the synchronization circuit 130 may stop providing the first clock signal DCLK according to the disablement of the active signal EN, so that the DLL circuit 110 enters an inactive state.

As shown in FIG. 6, after the time point T63, when the DLL circuit 110 receives a command (for example, an auto-refresh command AR) after a specific time period TS3 the DLL circuit 110 may be triggered to return to the active state at a time point T64 to relock the delay time during which the first clock signal DCLK is being delayed, and the delay locking information SEL and the loop delay information CNT_LP are updated accordingly. Thereafter, the DLL circuit 110 may again enter the inactive state at the time point T64. In an alternative embodiment, after the DLL circuit 110 enters the inactive state, the DLL circuit 110 may be triggered back to the active state after a specific time period (for instance, 70 microseconds) to periodically and properly update the delay locking information SEL and the loop delay information CNT_LP without using a command.

Figure 7:
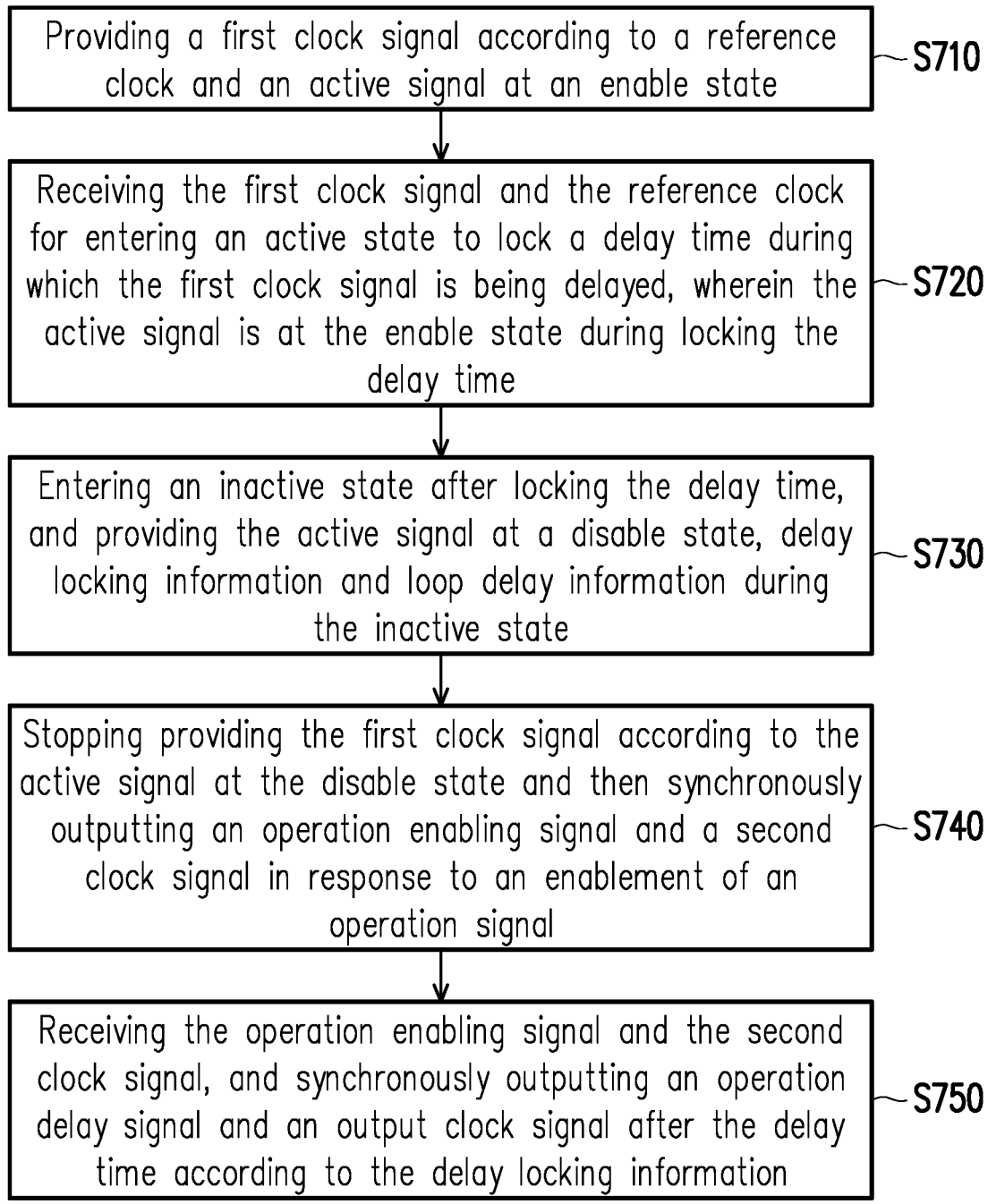
FIG. 7 is a flow chart illustrating a latency control method according to an embodiment of the disclosure.

FIG. 7 is a flow chart illustrating a latency control method according to an embodiment of the disclosure. With reference to FIG. 7, in the present embodiment, the latency control method of signals includes following steps. A first clock signal is generated according to a reference clock and an active signal at an enable state and is provided to a DLL circuit (step S710). After receiving the first clock signal and the reference clock, the DLL circuit is activated to enter an active state for locking a delay time during which the first clock signal is being delayed, wherein the active signal is at the enable state during locking the delay time (step S720). After locking the delay time, the DLL circuit is inactivated to enter an inactive state thereby providing the active signal at a disable state, delay locking information and loop delay information during the inactive state (step S730). Stop providing the first clock signal according to the active signal at the disable state and then synchronously output an operation enabling signal and a second clock signal in response to an enablement of an operation signal (step S740). Finally, a delay line circuit is used for receiving the delay locking information, the operation enabling signal and the second clock signal, and synchronously outputting an operation delay signal and an output clock signal after the delay time according to the delay locking information (step S750). The implementation details of the foregoing steps S710, S720, S730, S740, and S750 are described in detail in the foregoing embodiments and thus are not explained hereinafter.

To sum up, in the latency control device provided in one or more embodiments of the disclosure, the delay line circuit other than the DLL circuit may be applied to delay the signal in the locked delay time when the DLL circuit enters the inactive state. Thereby, the DLL circuit can stay in the inactive state during the reading operation and the ODT operation, so as to reduce the power consumption.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A latency control circuit comprising:
   a delay-locked loop circuit, configured to receive a first clock signal and a reference clock for entering an active state to lock a delay time during which the first clock signal is being delayed, and provide an active signal at an enable state during locking the delay time, wherein the delay-locked loop circuit enters an inactive state after the delay time is locked, and provides the active signal at a disable state, delay locking information and loop delay information during the inactive state;
   a synchronization circuit coupled to the delay-locked loop circuit, configured to receive the reference clock and an operation signal, and provide the first clock signal to the delay-locked loop circuit according to the reference clock and the active signal at the enable state, wherein the synchronization circuit stops providing the first clock signal according to the active signal at the disable state and then synchronously outputs an operation enabling signal and a second clock signal in response to an enablement of the operation signal; and a delay line circuit coupled to the delay-locked loop circuit and the synchronization circuit, configured to receive the delay locking information, the operation enabling signal, and the second clock signal, and synchronously output an operation delay signal and an output clock signal after the delay time.

2. The latency control circuit according to claim 1, further comprising:

a latency counter circuit coupled to the delay-locked loop circuit, configured to delay the enablement of the operation signal according to the reference clock, an operation command and the loop delay information.

3. The latency control circuit according to claim 1, wherein the operation signal comprises a reading operation signal or an on-die termination operation signal, the operation enabling signal comprises a reading operation enabling signal or an on-die termination operation enabling signal, and the synchronization circuit is configured to synchronously outputs the reading operation enabling signal and the second clock signal in response to an enablement of the reading operation signal or synchronously outputs the on-die termination operation enabling signal and the second clock signal in response to an enablement of the on-die termination operation signal.

4. The latency control circuit according to claim 2, wherein the delay-locked loop circuit comprises:

a delay time determination circuit, configured to receive the first clock signal and the delay locking information and output a delayed clock signal after the delay time;

a replica circuit coupled to the delay time determination circuit, configured to receive the delayed clock signal and provide a feedback clock signal;

a comparator circuit coupled to the replica circuit, configured to receive the reference clock and the feedback clock signal, compare a phase difference between the reference clock and the feedback clock signal so as to provide a comparison result, and provide a delayed reference clock with the same phase as the reference clock and a delayed feedback clock signal with the same phase as the feedback clock signal; and a delay locking control circuit coupled to the delay time determination circuit and the comparator circuit, configured to output the delay locking information and the loop delay information according to the delayed reference clock, the delayed feedback clock signal and the comparison result.

5. The latency control circuit according to claim 4, wherein the delay line circuit and the delay time determination circuit are configured to respectively adjust delay progressions of the delay line circuit and the delay time determination circuit according to the delay locking information, so as to determine the delay time.

6. The latency control circuit according to claim 4, wherein the delay locking control circuit comprises:

a delay selection circuit, configured to receive the delayed reference clock and the comparison result to perform a DLL locking algorithm, provide the delay locking information according to the comparison result, and generate a lock-in signal for indicating that a DLL locking operation is finished after the DLL locking algorithm is completed;

a loop delay control circuit coupled to the delay selection circuit, configured to receive the delayed reference clock, change the active signal to be at the disable state, and output the active signal at the disable state to the synchronization circuit after the lock-in signal is generated; and a loop delay counter, coupled to the loop delay control circuit, configured to receive the delayed reference clock and the delayed feedback clock signal, and generate the loop delay information based on count number of clocks counting from receiving the delayed feedback clock signal until the delayed feedback clock signal is interrupted, wherein the delayed feedback clock signal is interrupted in response to the active signal at the disable state.

7. The latency control circuit according to claim 1, wherein the operation delay signal and the output clock signal are configured to control an output circuit to output data.

8. The latency control circuit according to claim 1, wherein after the delay-locked loop circuit enters the inactive state, the delay-locked loop circuit is triggered by a command to return to the active state after a specific time period, so as to update the delay locking information and the loop delay information.

9. The latency control circuit according to claim 1, wherein after the delay-locked loop circuit enters the inactive state, the delay-locked loop circuit is triggered without a command to return to the active state after a specific time period, so as to periodically update the delay locking information and the loop delay information.

10. The latency control circuit according to claim 2, wherein the operation command comprises an additional latency, a column address strobe latency, a column address strobe write latency, burst information and a command signal, wherein the latency counter circuit comprises:

a decoder, configured to receive the reference clock for operating, decode the loop delay information, the column address strobe latency or the column address strobe write latency to output a decoded result;

a command control circuit, configured to receive the reference clock for operating, manipulate the command signal to make a command pulse or a combination of a first command pulse and a last command pulse based on the additional latency and the burst information, and output a corresponding command control signal; and a shift register, coupled to the decoder and the command control circuit, configured to receive the reference clock for operating, and enable the operation signal after delaying a time period according to the decoded result and the corresponding command control signal.

11. The latency control circuit according to claim 3, wherein the synchronization circuit comprises:

a synchronization control circuit, configured to receive the reading operation signal or the on-die termination operation signal, combine the reference clock with the reading operation signal or the on-die termination operation signal to generate a sub-reading operation signal or a sub-on-die termination operation signal, and output a sub-reference clock in response to receiving the reading operation signal or the ODT operation signal;

a delay control circuit, configured to delay the reference clock to output a control signal; and a plurality of control units, coupled to the synchronization control circuit and the delay control circuit, respectively control a plurality of clock gating circuits for a related timing among the reading operation enabling signal, the on-die termination operation enabling signal, the second clock signal and the first clock signal according to the control signal.

12. A latency control method comprising:
providing a first clock signal to a delay-locked loop circuit according to a reference clock and an active signal at an enable state;
in response to receiving the first clock signal and the reference clock, activating the delay-locked loop circuit to lock a delay time during which the first clock signal is being delayed, wherein the active signal is at the enable state during locking the delay time;
after the delay time being locked, inactivating the delay-locked loop circuit and providing the active signal at a disable state, delay locking information and loop delay information by the inactivated delay-locked loop circuit;
stopping providing the first clock signal according to the active signal at the disable state and then synchronously outputting an operation enabling signal and a second clock signal in response to an enablement of an operation signal; and
receiving the delay locking information, the operation enabling signal and the second clock signal by a delay line circuit, and synchronously outputting an operation delay signal and an output clock signal by the delay line circuit after the delay time according to the delay locking information.

13. The latency control method according to claim 12, further comprising:
delaying the enablement of the operation signal according to the reference clock, an operation command and the loop delay information.

14. The latency control method according to claim 12, wherein the operation signal comprises a reading operation signal or an on-die termination operation signal, the operation enabling signal comprises a reading operation enabling signal or an on-die termination operation enabling signal, the step of synchronously outputting the operation enabling signal and the second clock signal in response to the enablement of the operation signal comprises:
synchronously outputting the reading operation enabling signal and the second clock signal in response to an enablement of the reading operation signal; or
synchronously outputting the on-die termination operation enabling signal and the second clock signal in response to an enablement of the on-die termination operation signal.

15. The latency control method according to claim 12, wherein the step of activating the delay-locked loop circuit comprises:
outputting a delayed clock signal after the delay time through a delay time determination circuit according to the first clock signal and the delay locking information;
providing a feedback clock signal according the delayed clock signal;
comparing a phase difference between the reference clock and the feedback clock signal so as to provide a comparison result;
providing a delayed reference clock with the same phase as the reference clock and a delayed feedback clock signal with the same phase as the feedback clock signal; and
outputting the delay locking information and the loop delay information according to the delayed reference clock, the delayed feedback clock signal and the comparison result.

16. The latency control method according to claim 15, further comprising:
adjusting delay progressions of the delay time determination circuit according to the delay locking information, so as to determine the delay time.

17. The latency control method according to claim 12, further comprising:
controlling an output circuit to output data according to the operation delay signal and the output clock signal.

18. The latency control method according to claim 12, wherein after the step of inactivating the delay-locked loop circuit, the method further comprises:
triggering the delay-locked loop circuit by a command to re-activate the delay-locked loop circuit after a specific time period, so as to update the delay locking information and the loop delay information.

19. The latency control method according to claim 12, wherein after the step of inactivating the delay-locked loop circuit, the method further comprises:
triggering the delay-locked loop circuit without a command to re-activate the delay-locked loop circuit after a specific time period, so as to periodically update the delay locking information and the loop delay information.

* * * * *